United States Patent [19]
Barlow

[11] Patent Number: 5,868,070
[45] Date of Patent: Feb. 9, 1999

[54] METHOD AND SYSTEM FOR APPLYING SOLDER PASTE ON TAPE CARRIER PACKAGE COMPONENT SITES

[75] Inventor: Stephen Allen Barlow, Wimberley, Tex.

[73] Assignee: International Business Machines Corporation, Armonk, N.Y.

[21] Appl. No.: 861,312

[22] Filed: May 19, 1997

[51] Int. Cl.[6] .............................. B41F 15/44; B41N 1/24
[52] U.S. Cl. ........................................... 101/123; 101/127
[58] Field of Search ................................... 101/123, 127, 101/128.21, 128.4, 129

[56] References Cited

U.S. PATENT DOCUMENTS

| | | | |
|---|---|---|---|
| 5,553,538 | 9/1996 | Freitag | 101/129 |
| 5,593,080 | 1/1997 | Teshima et al. | 101/127 |
| 5,715,748 | 2/1998 | Murakami et al. | 101/114 |

FOREIGN PATENT DOCUMENTS

| | | | |
|---|---|---|---|
| 63338 | 3/1993 | Japan | 101/129 |
| 155954 | 6/1994 | Japan | 101/127 |
| 7052592A | 2/1995 | Japan . | |
| 8015717A | 1/1996 | Japan . | |
| 8055646A | 2/1996 | Japan . | |

*Primary Examiner*—Stephen R. Funk
*Attorney, Agent, or Firm*—Casimer K. Salys; Antony P. Ng; Andrew J. Dillon

[57] ABSTRACT

A method for applying solder paste on tape carrier package component sites of a printed circuit board is disclosed. In accordance with a method and system of the present invention, a stencil having multiple openings for each device pad on the printed circuit board is provided. Each of the openings is approximately 0.012"×0.0053" in size. The stencil is then secured in a fixed position directly above a printed circuit board. Finally, solder paste is selectively applied to the printed circuit board through the stencil with an applicator.

7 Claims, 3 Drawing Sheets

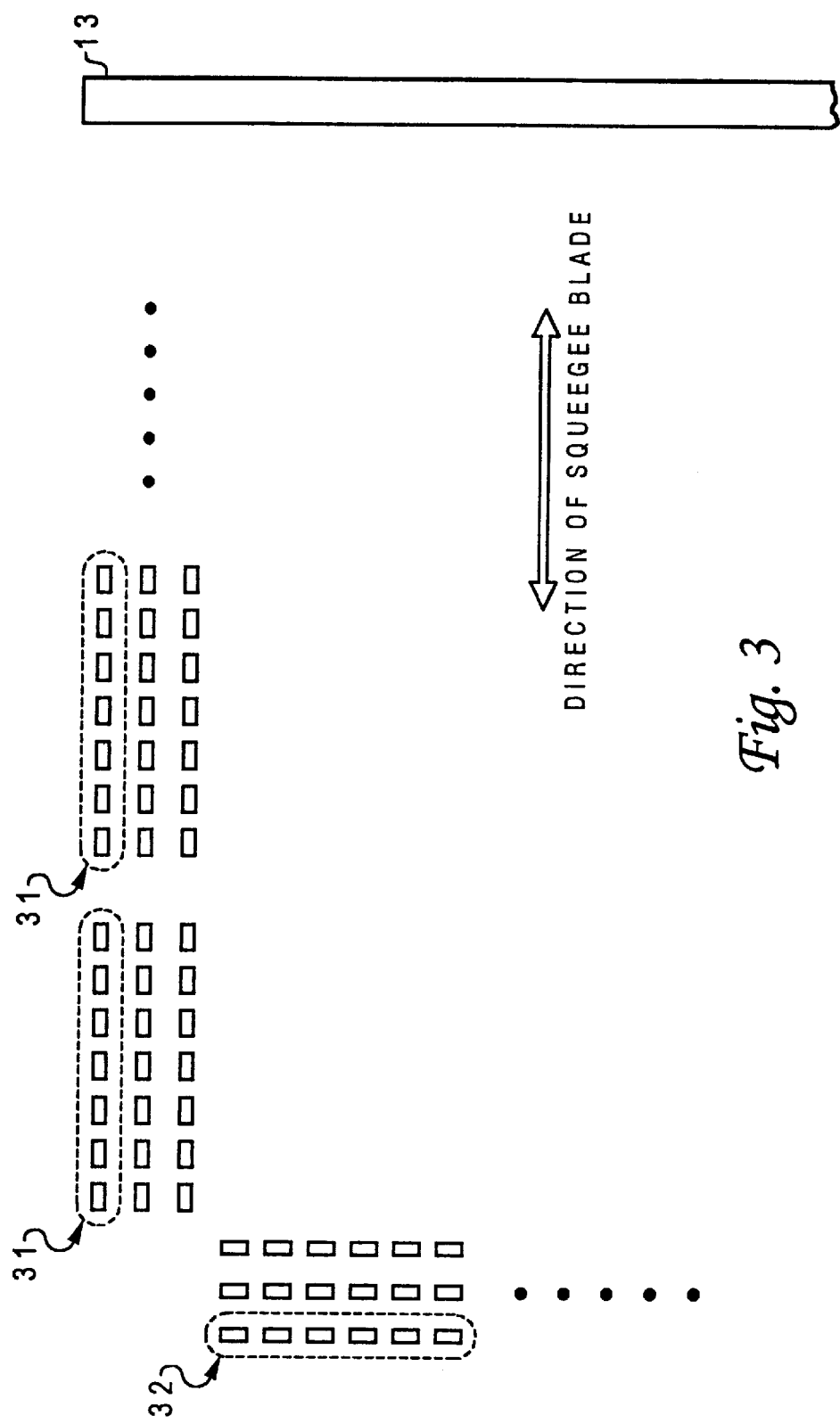

METHOD AND SYSTEM FOR APPLYING SOLDER PASTE ON TAPE CARRIER PACKAGE COMPONENT SITES

BACKGROUND OF THE INVENTION

1. Technical Field

The present invention relates to a method and system for processing printed circuit boards in general and, in particular, to a method and system for applying solder paste to printed circuit boards. Still more particularly, the present invention relates to a method and system for applying solder paste on tape carrier package component sites of a printed circuit board.

2. Description of the Prior Art

Solder paste printing is one of the many methods for applying solder on a printed circuit board. During solder paste printing, a reflowable conductive solder paste is selectively applied to a printed circuit board by a screen printer, prior to placement of electronic components on the printed circuit board.

Typically, a conveyor belt shuttles the printed circuit board first beneath a fixed camera, which records and transmits the position of the printed circuit board to a computer, and then beneath a frame, which holds a stencil corresponding to the printed circuit board. In response to reception of the positional information from the camera, the computer calculates alignment information, which is transmitted to a servo-motor coupled to the frame. The servo-motor subsequently makes adjustments in the x, y, and $\phi$ coordinates of the frame such that the stencil is properly aligned with the printed circuit board. Finally, the properly aligned stencil is dropped into contact with the printed circuit board, and a squeegee blade wipes across the stencil to push the conductive solder paste through openings in the stencil onto the printed circuit board.

At the completion of the solder paste printing process, the stencil is lifted from the printed circuit board, and the printed circuit board is conveyed from beneath the stencil by the conveyor belt.

Tape Carrier Package (TCP) devices are one of the many types of packaged electronic components that may be added to the printed circuit board after the solder paste printing process. TCP devices are characterized by their size compactness and have high-lead-count with ultra-fine pitch spacing between leads. Accordingly, it is quite difficult to apply the correct amount of solder paste onto the corresponding fine pitch pads of the printed circuit board. In fact, instead of utilizing the solder paste printing process as described above, a more common method for applying solder on a printed circuit board having such fine pitch pads is by solder plating of the entire printed circuit board during the printed circuit board manufacturing. However, this method is expensive, and costs from $4 to $25 per printed circuit board, depending on the board size and complexity.

Consequently, it would be desirable to provide an improved method for applying solder paste on tape carrier package component sites of a printed circuit board that is less expensive.

SUMMARY OF THE INVENTION

In view of the foregoing, it is therefore an object of the present invention to provide an improved method and system for processing printed circuit boards.

It is another object of the present invention to provide an improved method and system for applying solder paste to printed circuit boards.

It is yet another object of the present invention to provide an improved method and system for applying solder paste on tape carrier package component sites of a printed circuit board.

In accordance with the method and system of the present invention, a stencil having multiple openings for each device pad on the printed circuit board is provided. Each of the openings is approximately 0.012"×0.0053" in size. The stencil is then secured in a fixed position directly above a printed circuit board. Finally, solder paste is selectively applied to the printed circuit board through the stencil with an applicator.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 3 is a pictorial diagram illustrating the stencil openings in accordance with a preferred embodiment of the present invention.

DETAILED DESCRIPTION OF A PREFERRED EMBODIMENT

The present invention is applicable to all screen-printing equipment for applying solder paste to printed circuit boards. Such printed circuit board may be utilized to carry various types of devices including Tape Carrier Package (TCP) devices.

Figure 1:
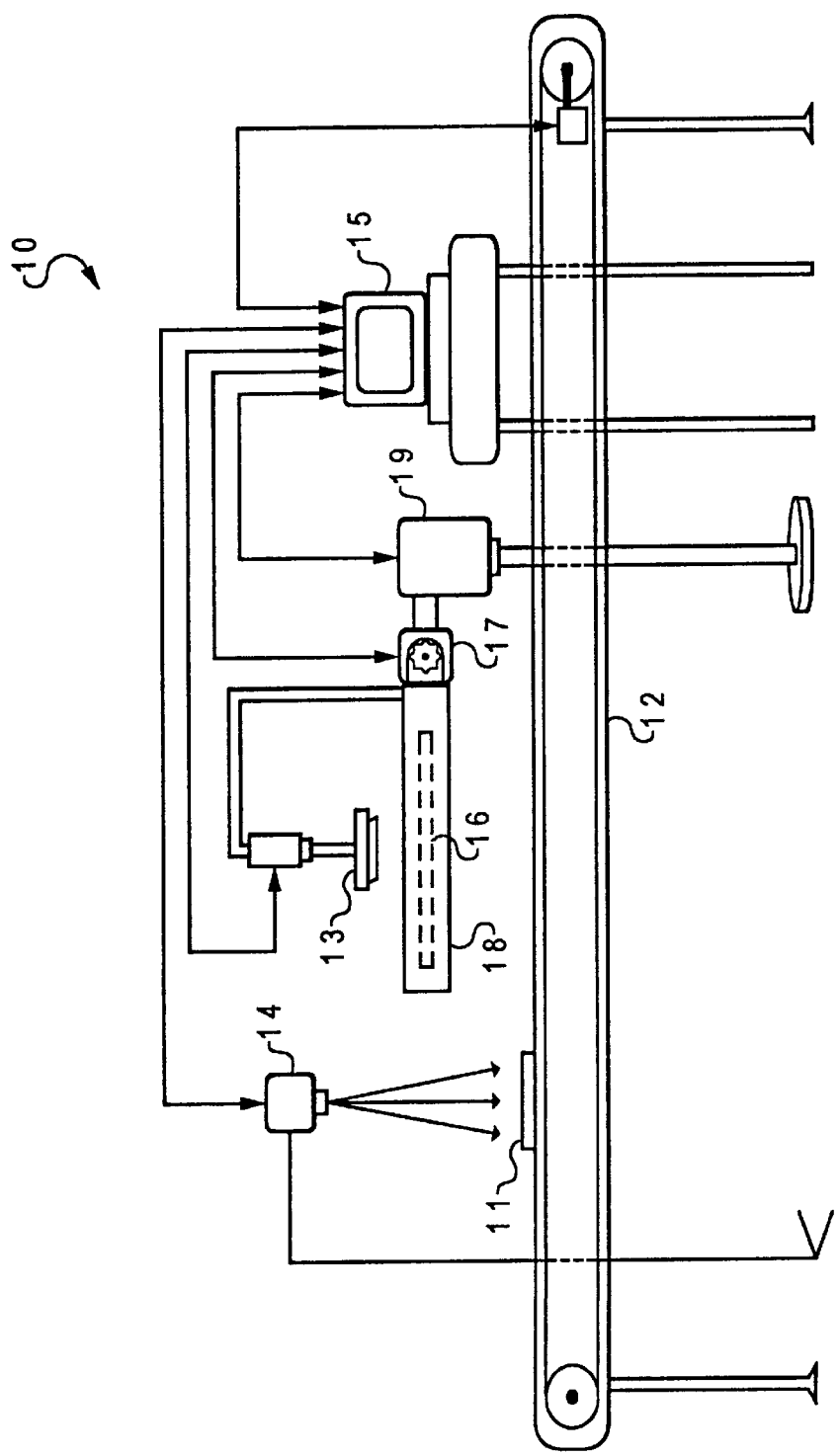
FIG. 1 is a pictorial diagram of a typical screen printer in which a preferred embodiment of the present invention is applicable.

Referring now to the drawings and, in particular, to FIG. 1, there is illustrated a pictorial diagram of a typical screen-printing equipment in which a preferred embodiment of the present invention is applicable. Screen printer 10 is utilized to apply solder paste to printed circuit board 11.

This process typically begins when printed board 11 is placed on a conveyor belt 12. When directed by a control unit 15, conveyor belt 12 conveys printed circuit board 11 to a first location beneath a fixed camera 14. Camera 14 then records an image of printed circuit board 11 for subsequent transmission to control unit 15. In response to reception of the recorded image, control unit 15 directs conveyor belt 12 to shuttle printed circuit board 11 to a second location beneath a solder stencil 16. Control unit 15 further calculates the exact position of printed circuit board 11 from printed circuit board features shown in recorded image and transmits an alignment signal to a servo-motor 17. In response, servo-motor 17 makes multi-axis alignment adjustments to the position of a frame 18 in which stencil 16 is mounted. When frame 18 is aligned correctly, a pneumatic arm 19 lowers frame 18 until stencil 16 contacts printed circuit board 11, at the direction of control unit 15.

Thereafter, a squeegee blade 13 is pneumatically lowered to wipe across stencil 16, thereby pushing solder paste through stencil 16 onto printed circuit board 11. In this manner, the solder paste is selectively applied to desired areas of printed circuit board 11.

If a second type of printed circuit board (i.e., a printed circuit board having different pad locations) is to be processed, control unit 15 must be reprogrammed to calculate and transmit the correct alignment instructions to frame 18 in response to the different features of the printed circuit board of the second type shown in the recorded image. Additionally, stencil 16 corresponding to the first type of printed circuit board must be removed from frame 18 and replaced with a stencil corresponding to the second type of printed circuit board.

Under the prior art, printing solder paste has been limited to a lead pitch spacing of 0.012". Because the openings in stencil 16 are so small at this lead pitch spacing, the limitations of solder paste applications are directly related to how a proper volume of solder paste can be reliably deposited. To make the matter worse, Tape Carrier Package (TCP) devices typically require lead pitch spacing of 0.010", causing solder paste application to be even more difficult. Thus, printing TCP component sites with a standard solder paste application process will result in either low solder volume deposited because of poor paste release from the ultra-small stencil openings, or excessive solder volume due to the ultra-fine lead spacing.

Figure 2:
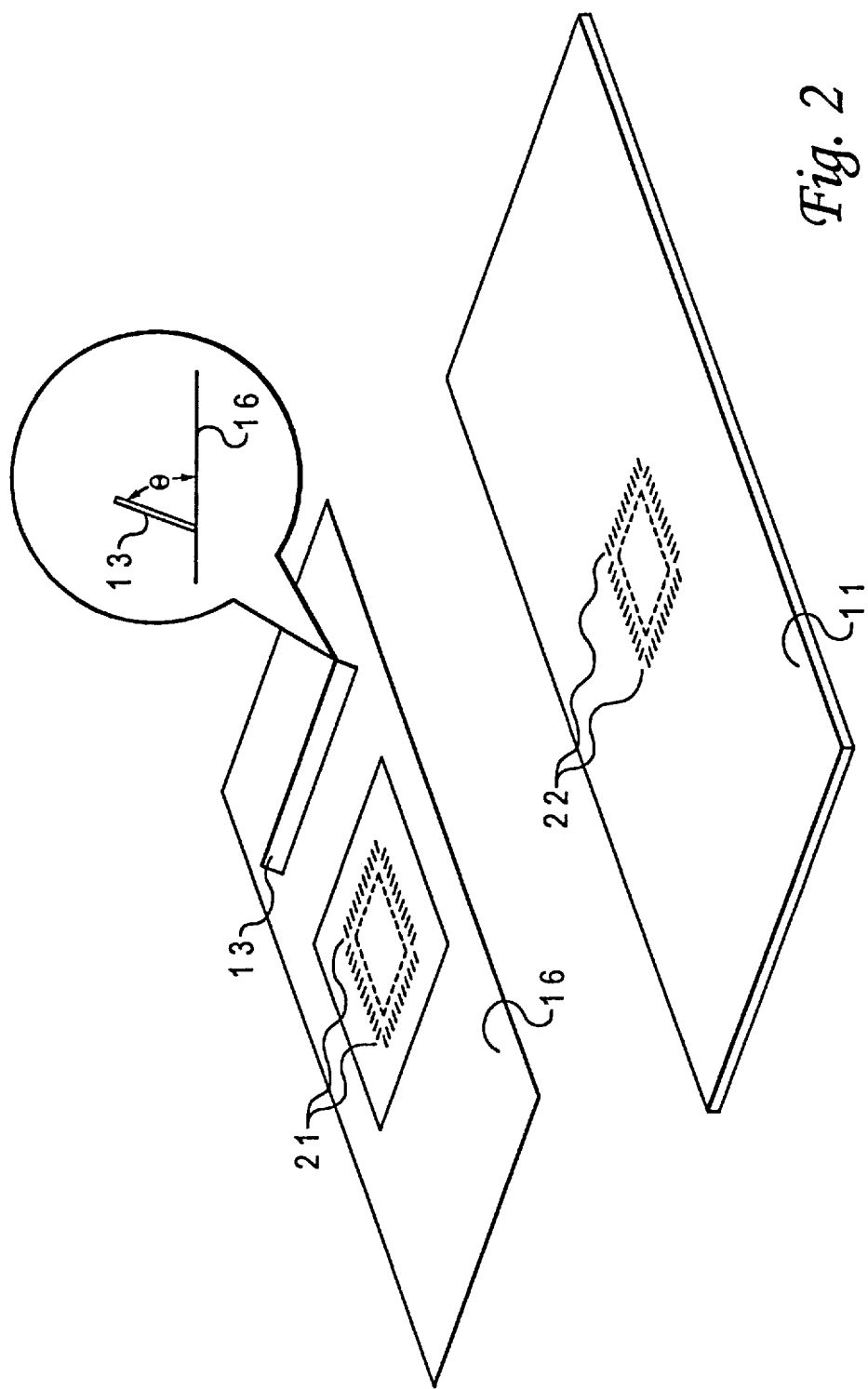
FIG. 2 is an isometric view of the stencil and the printed circuit board of FIG. 1, in accordance with a preferred embodiment of the present invention.

With reference now to FIG. 2, there is illustrated an isometric view of the stencil and the printed circuit board of FIG. 1, in accordance with a preferred embodiment of the present invention. Stencil 16 is a thin sheet of stainless steel with apertures or openings 21 that are cut to match the image of the component pads on a corresponding printed circuit board, such as printed circuit board 11. Stencil 16 is mounted within a screen-printing equipment, such as screen printer 10 as shown FIG. 1.

After printed circuit board 11 has been aligned with the stencil image on stencil 16, solder paste is then applied to the top side of stencil 16. Solder paste is preferably comprised of fine particles of tin/lead solder held together with a flux mixture. Subsequently, squeegee blade 13 is moved across stencil 16. As squeegee blade 13 moves across stencil 16, the solder paste is pushed through openings 21 of stencil 16 and deposited onto pads 22 of printed circuit board 11. After an appropriate amount of solder paste has been deposited onto pads 22, electronic components, such as TCP devices, are then placed on the wet solder paste. Finally, heat is applied to the specific locations of printed circuit board 11 until the solder paste melts and eventually cools to form solid solder joints.

Under the present invention, the process utilizes a very fine particle-size solder paste, a stencil design for controlling solder volume at the TCP sites, and a controlled set of printer parameters. First of all, the solder paste is preferably a −400+500 mesh water-soluble or no-clean product.

Second, stencil design comprises a series of small openings for each pad on the TCP site. Referring now to FIG. 3, there is depicted a pictorial diagram illustrating the stencil openings in accordance with a preferred embodiment of the present invention. For each pad 31, the corresponding stencil openings are preferably arranged in seven separate openings when pad 31 is perpendicular to squeegee blade 13, although six separate openings will suffice. For each pad 32, the corresponding stencil openings are preferably arranged in six separate openings if pad 32 is parallel to squeegee blade 13, although seven separate openings will also be acceptable. Each stencil opening is preferably 0.012"×0.0053" in size for a TCP pad that is approximately 0.118"×0.006". In addition, stencil 16 is preferably 0.005" thick and stepped down to 0.0025" in the TCP area.

Also shown in FIG. 2, the blade angle θ between squeegee blade 13 and stencil 16 is preferably within a range of 65°–70°. An angle within this preferred range is maintained during the entire solder paste application process.

Last, but not least, the pressure of squeegee blade 13 is set at preferably 1–2 of squeegee blade 13, and the speed of squeegee blade 13 is set at preferably 0.7–1.0 inches-per-second. In addition, snap-off is set to preferably between 0.000 and −0.030 while no slow snap-off is utilized.

As has been described, the present invention provides an improved method and system for applying solder paste on TCP component sites. The present disclosure details a process where solder paste is applied to a "raw" printed circuit board, and then heat is applied to the printed circuit board for forming solder deposits with TCP components. The process of solder application under the present invention costs about $1–$2 per printed circuit board.

While the invention has been particularly shown and described with reference to a preferred embodiment, it will be understood by those skilled in the art that various changes in form and detail may be made therein without departing from the spirit and scope of the invention.

What is claimed is:

1. A screen printer for selectively applying solder paste to a printed circuit board having a plurality of device pads, said screen printer comprising:

mobile placement equipment for receiving and transporting said printed circuit board;

application equipment for selectively applying a solder paste to said printed circuit board, said application equipment comprising:

a stencil having a plurality of openings for each of said plurality of device pads;

a frame for securing said stencil in a fixed position; and an applicator for selectively applying said solder paste to said printed circuit board through said stencil at 1 to 2 psi and at a speed of 0.7 to 1.0 inches-per-second.

2. The screen printer for selectively applying solder paste to a printed circuit board according to claim 1, further comprising solder paste wherein said solder paste is a −400+500 mesh water-soluble or no-clean product.

3. The screen printer for selectively applying solder paste to a printed circuit board according to claim 1, wherein said screen printer further includes a means for maintaining an angle between 65° to 70° between said applicator and said stencil during said solder paste application.

4. The screen printer for selectively applying solder paste to a printed circuit board according to claim 1, wherein each of said openings of said stencil is approximately 0.012"× 0.0053" in size.

5. The screen printer for selectively applying solder paste to a printed circuit board according to claim 1, wherein said stencil further includes seven separate openings for each device pad on said printed circuit, said openings being arranged perpendicular to a direction in which said solder paste is applied.

6. The screen printer for selectively applying solder paste to a printed circuit board according to claim 1, wherein said stencil further includes six separate openings for each device pad on said printed circuit, said openings being arranged in parallel to a direction in which said solder paste is applied.

7. The screen printer for selectively applying solder paste to a printed circuit board according to claim 1, wherein a snap-off of said stencil is set between 0.000 and −0.030.

* * * * *

UNITED STATES PATENT AND TRADEMARK OFFICE
CERTIFICATE OF CORRECTION

PATENT NO. : 5,868,070
DATED : Feb. 9, 1999
INVENTOR(S) : *Barlow*

It is certified that error appears in the above-identified patent and that said Letters Patent is hereby corrected as shown below:

At col. 4, line 6, insert -- psi -- after "1-2".

Signed and Sealed this

Twenty-fourth Day of August, 1999

Attest:

Q. TODD DICKINSON

*Attesting Officer*    *Acting Commissioner of Patents and Trademarks*